United States Patent [19]

Teggatz et al.

[11] Patent Number: 5,710,515

[45] Date of Patent: Jan. 20, 1998

[54] NON-VOLATILE MEMORY IN POWER AND LINEAR INTEGRATED CIRCUITS

[75] Inventors: Ross E. Teggatz; Joseph A. Devore, both of Dallas; Stephen L. Sutton, McKinney, all of Tex.; Ganapathy R. Subramaniam, Bangalore, India

[73] Assignee: Texas Instruments Incorporated, Dallas, Tex.

[21] Appl. No.: 480,063

[22] Filed: Jun. 7, 1995

Related U.S. Application Data

[62] Division of Ser. No. 113,575, Aug. 27, 1993, abandoned.

[51] Int. Cl.[6] .......................... G01R 31/02; G01R 31/00; G08B 21/00
[52] U.S. Cl. .......................... 324/763; 324/512; 340/598
[58] Field of Search .......................... 324/512, 763, 324/760; 340/598; 326/38, 39; 327/546

[56] References Cited

U.S. PATENT DOCUMENTS

| | | | |
|---|---|---|---|
| 4,137,467 | 1/1979 | Plog | 340/598 |
| 4,924,212 | 5/1990 | Fruhauf et al. | 340/598 |
| 4,970,497 | 11/1990 | Broadwater et al. | 340/598 |
| 5,070,322 | 12/1991 | Fujihira | 340/598 |
| 5,349,336 | 9/1994 | Nishiura et al. | 340/598 |
| 5,355,123 | 10/1994 | Nishiura et al. | 340/598 |
| 5,396,130 | 3/1995 | Galbraith et al. | 327/546 |

*Primary Examiner*—Ernest F. Karlsen
*Attorney, Agent, or Firm*—Warren L. Franz; Wade James Brady, III; Richard L. Donaldson

[57] ABSTRACT

A testable temperature warning circuit (120) in an integrated circuit substrate (124) provides a warning if the substrate temperature exceeds a critical temperature. A programming circuit (140) controls a selection, circuit (128) to establish a programmably selectable temperature at either the critical temperature or a second predetermined temperature lower than the critical temperature to enable the warning circuit operation to be tested at a temperature lower than the critical temperature. In one embodiment, the selection circuit 128 comprises a current source that produces a voltage drop across the resistor 121 and base-emitter of the transistor 122 produces a substrate temperature indicating current of magnitude related to the temperature of the substrate. The substrate temperature indicating current at the second temperature is extrapolatingly related to the substrate temperature indicating current at the critical temperature. A method is also presented for testing a temperature warning circuit fabricated in an integrated circuit substrate.

15 Claims, 9 Drawing Sheets

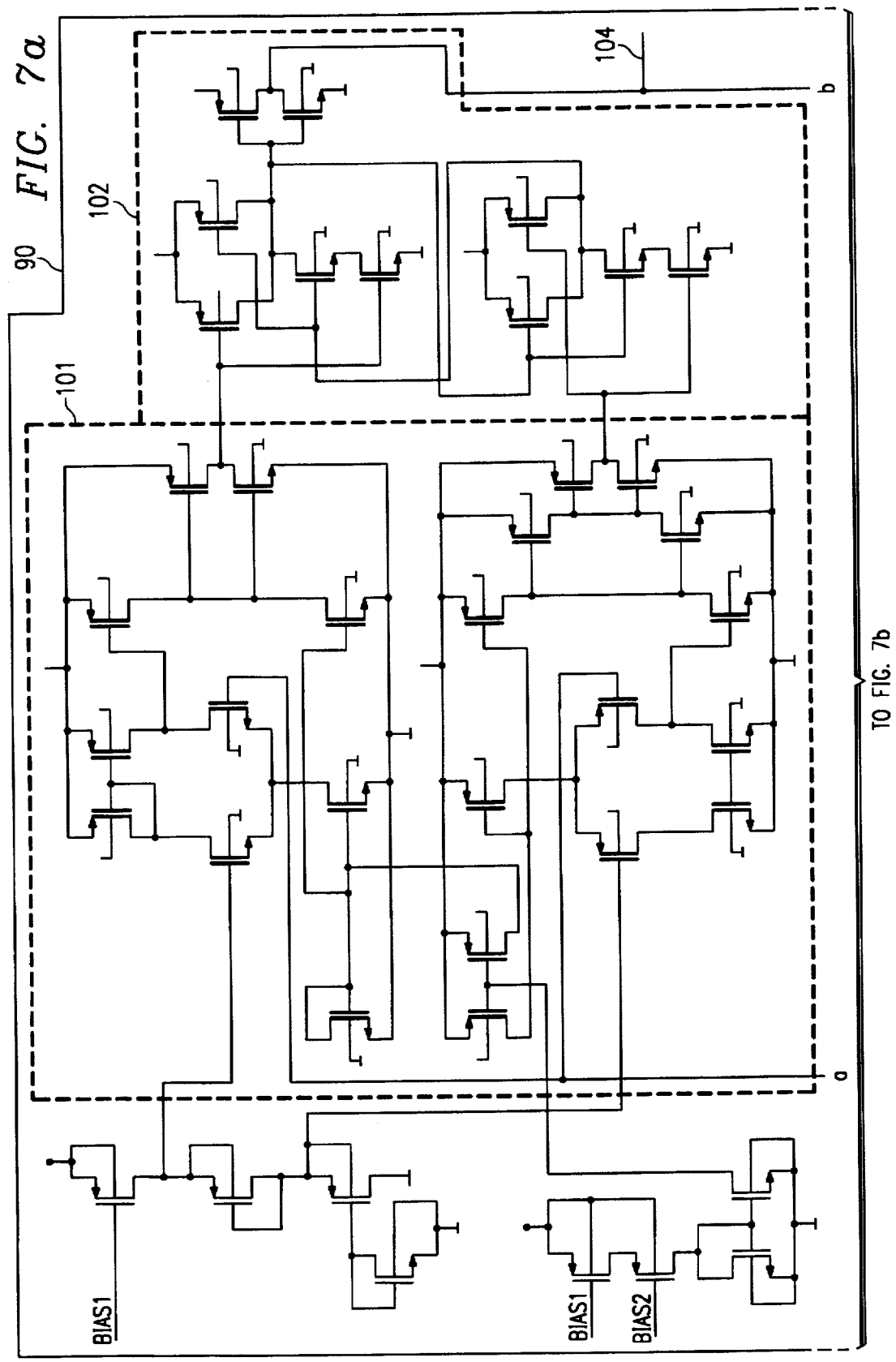

NON-VOLATILE MEMORY IN POWER AND LINEAR INTEGRATED CIRCUITS

This is a divisional of application Ser. No. 08/113,575, filed Aug. 27, 1993, now abandoned.

BACKGROUND OF THE INVENTION

1. Field of the Invention

This invention relates to improvements in integrated circuits, and more particularly to improvements in linear or power integrated circuits, and methods for configuring same; to improvements in current sources and methods for configuring same; to improvements in oscillator circuits, and methods for configuring same; and to improvements in integrated circuit temperature testing circuits, and to methods for non-destructively testing such testing circuits.

2. Relevant Background

A wide variety of different types of linear circuits are presently available for user selection. Among the various device types are linear devices, power circuits, and so forth, examples of typical power circuits being designated, for example, by type numbers SN75439; SN74HC595; SN74HC273; SN74HC259, and so on. These device types, of course, are merely exemplary, and are noted only because they are specifically exemplified in the description below. The numbers and types of power circuits that are available are of course manifold.

Generally available linear integrated circuits are usually packaged one to a package. Although the package pin-outs may be standard, the circuit components and functions may vary depending upon the desired circuit uses. In power circuits, for example, different power circuits may be required for powering inductive loads such as drive solenoids, fractional horse power motors, and so on. Still other circuit types may be required for driving non-inductive loads.

Thus, manufacturers typically provide a "standard" integrated circuit part having standard circuit components and a "core" circuit that varies according to the particular circuit type being produced. For instance, typically a standard power circuit family may include similar input and output circuitry, controller circuitry, DMOS pre-drive circuitry, and so on, with only a "core" circuit that may be substituted from part to part in the family. This is the case for the power circuits enumerated above, for instance.

Although standard parts are typically produced, in the past some variability or programmability of individual linear circuits has been provided. One way in which such programmability has been imparted to circuits that are fabricated generically on a single substrate is by the manufacturer selecting various metallization patterns during fabrication, in accordance with specific customer specifications. This of course requires significant lead time in the manufacture of such custom devices, and typically results in increased cost of the devices to the customer.

Another way in which programmability or circuit variability has been provided has been by way of customer or user activated fuse lengths, "antifuses", or devices such as so-called "Zener zaps", in which conduction paths have been varied through application of particular programming voltages to circuits that contain the fuse length or antifuse. Such circuits, however, typically have been applied to specifically configure input or output circuit configurations, but do not address the overall circuit function. Moreover, such fuse lengths additionally have attendant problems such as dealing with debris created in the activation of the antifuse or in reliability in confirming that a particular fuse length path has been properly established.

In addition, in the past it has been proposed to provide user configurable output structures in integrated circuits through provision of both a power circuit and digital logic functions on the same chip. Again, however, the user configurations are generally limited to configuring the output circuitry, without enabling the basic overall function of the circuit to be changed.

Moreover, typically in the past, in order to provide for circuit function selection, from a system designer's standpoint, some external components had to be utilized. For example, external pins have been used to change the functionality of a part. Aside from considerations related to selecting a function of a device, with regard to control and selection of electrical parameter variations in a circuit, external components are generally used for this type of change or adjustment. For example, providing an external RC network to vary an oscillator frequency is a well known way of externally varying a circuit parameter. In some cases, electrical variation of some parameters is difficult, if not impossible, to implement, even with added external components.

Therefore, a user generally must specify and purchase a particular circuit type integrated circuit, or particular external components, to perform the particular function in his specific designs, or that can be easily configured with available external parts to perform the desired circuit function. The ultimate result is increased cost to the user, since at the manufacturing level specific integrated circuit parts are produced for each anticipated user purpose. It can be readily seen that since a finite number of individual parts exist, the design flexibility of part users also is limited by the specific parts available and, if more than one type is needed in a particular application, by the space available in a particular user application.

One problem that exists with virtually all systems is field failures. Field failures of one component can ultimately cause system destruction. On the other hand, field failures can sometimes allow the system to continue to work, but work incorrectly. Such failures can be permanent or intermittent. If the failure is permanent, it can be easily recognized by the field technician fixing the system. However, if the failure is intermittent, it can be very difficult to resolve. In critical or complex cases, with regard to fault history, some form of microprocessor is often required to monitor fault signals produced by the integrated circuit in order to try to obtain useful fault identification information.

SUMMARY OF THE INVENTION

In light of the above, it is, therefore, an object of the invention to provide an improved multi-function integrated circuit.

It is another object of the invention to provide an improved integrated circuit of the type described that is particularly suited for applications such as linear or power integrated circuit applications.

It is another object of the invention to provide an improved integrated circuit of the type described in which various linear or power circuits or circuit functions can be user selected or programmed.

It is yet another object of the invention to provide a method for operating an integrated circuit to programmably configure the circuit to have a circuit function selectable from among a plurality of integrated circuits on a single integrated circuit chip that each provide a different function.

It is another object of the invention to provide a circuit having user adjustable parametric parameters.

It is another object of the invention to provide a current source having a user programmable output current trim.

It is another object of the invention to provide an oscillator having a user programmable adjustable oscillation frequency.

It is another object of the invention to provide an substrate temperature warning circuit having a user programmable temperature warning threshold.

It is another object of the invention to provide a testable warning circuit fabricated in an integrated circuit substrate to provide a warning if the temperature of the substrate exceeds a critical temperature.

It is another object of the invention to provide a testable warning circuit of the type described the operation of which at the critical temperature can be tested at a temperature lower than the critical temperature.

It is another object of the invention to provide a method for testing a temperature warning circuit of the type described fabricated in an integrated circuit substrate, for correct operation at a critical substrate temperature at substrate temperatures below the critical substrate temperature.

It is yet another object of the invention to provide a current source fabricated in an integrated circuit substrate for providing an output current having an adjustable magnitude.

It is still yet another object of the invention to provide a method for producing an output current that is externally programmable by a user.

It is still yet another object of the invention to provide a method and circuit capability that can be used, such as in motor driver circuits, to provide selectivity in providing programmability in circuit output type; for example, in a motor driver circuit a low side driver can be user configured to have a pwm mode of operation with flyback voltage handling capabilities, a ½ H-Bridge circuit type can be user configured by enabling both high and low side drivers, a high side driver with flyback voltage handling capabilities can be user configured, and so on.

These and other objects, features and advantages of the invention will be apparent to those skilled in the art from the following detailed description of the invention, when read in conjunction with the accompanying drawings and appended claims.

According to a broad aspect of the invention, an integrated circuit, such as a power integrated circuit, or the like, contained in a single integrated circuit chip having a plurality of input lines and a plurality of output lines is presented. The integrated circuit includes a plurality of selectable integrated circuits, at least one being a power or linear integrated circuit.

Each of the selectable integrated circuits has a plurality of input lines and a plurality of output lines, and is configured to modify a signal applied to the input lines to produce a modified output signal on the plurality of output lines. A digital programming circuit programmably selects one of the selectable integrated circuits for connection between input and output lines of the integrated circuit. The programming circuit may comprise a programmable memory circuitry, such as an EPROM, and EEPROM, or the like, operative to apply selection signals to control selection of input lines to and from the selectable integrated circuits.

In another broad aspect of the invention, an integrated circuit, contained on a single integrated circuit chip, has a plurality of demultiplexer circuits. Each of the demultiplexer circuits is connected to at least one input line, a plurality of output lines, and a plurality of selection lines operative to connect the at least one input line to a selected output line dependent upon logic state signals applied to the selection lines.

Additionally, the integrated circuit has a plurality of selectable integrated circuits, at least one of which being a linear or power integrated circuit. Each of the selectable integrated circuits has a plurality of functional input lines connected to receive respective output lines from each of the demultiplexer circuits, and a plurality of output lines. The selectable integrated circuits are each operative to modify a signal applied to the functional input lines to produce a modified output signal on the plurality of output lines.

A plurality of multiplexer circuits are also provided, each having a plurality of input lines, a plurality of output lines, and a plurality of selection lines. The input lines of each multiplexer circuit are connected to respective ones of the output lines from the selectable integrated circuits. The demultiplexer circuits are operative to apply respective one of the input lines to a selected output line, dependent upon logic state signals applied to the selection lines.

The programming circuit comprises programmable memory circuitry, such as EPROM circuitry, or the like, operative to operate the demultiplexer and multiplexer to apply selection signals to control selection of input lines to and from the selectable integrated circuits.

In still another broad aspect of the invention, a multi-function power integrated circuit contained on a single integrated circuit chip having a plurality of input lines and a plurality of output lines are provided. The multi-function power integrated circuit has a plurality of demultiplexer circuits, a plurality of selectable power integrated circuits, and a plurality of demultiplexer circuits.

In yet another broad aspect of the invention, a method for operating an integrated circuit having a plurality of input lines and a plurality of output lines are presented. The method includes providing a plurality of selectable integrated circuits on a single integrated circuit chip, at least one being a linear integrated circuit, or a power integrated circuit, and programmably selecting one of the selectable integrated circuits for connection between input and output lines of the integrated circuit.

The step of programmably selecting one of the selectable integrated circuits for connection between input and output lines of the integrated circuit may comprise programming EPROM circuitry operative to select the input and output lines to and from the selectable integrated circuits.

In accordance with a broad aspect of the invention, a circuit is provided that has user adjustable parametric parameters. The circuit includes an analog circuit having at least one adjustable parameter, and a digital non-volatile user programming circuit, comprising, for example, EPROM devices, connected to control the at least one adjustable parameter.

In one embodiment, the analog circuit is a current source to supply an output current, and the digital non-volatile user programming circuit is connected to trim the output current.

In another embodiment, the analog circuit is an oscillator to supply an output signal at an oscillation frequency, and the digital non-volatile user programming circuit is connected to adjust the oscillation frequency.

In yet another embodiment, the analog circuit is an substrate temperature warning circuit to supply warning if a temperature of the substrate exceeds a selectable threshold, and the digital non-volatile user programming circuit is connected to select the threshold.

In accordance with another broad aspect of the invention, a testable warning circuit is fabricated in an integrated circuit substrate to provide a warning if a temperature of the substrate exceeds a critical temperature. The critical temperature can be, for example, a temperature above which operation of an operating circuit on the substrate is not desired. The warning circuit has a circuit for generating a warning if the temperature of the substrate exceeds a programmably selectable temperature. A programming circuit, such as an externally programmable non-volatile memory, comprising EEPROMs or the like, controls a selection circuit that is responsive to the contents of the non-volatile memory for establishing the programmably selectable temperature at either the critical temperature or a second predetermined temperature lower than the critical temperature to enable the warning circuit operation to be tested at a temperature lower than the critical temperature.

In one embodiment, the selection circuit comprises a current source that produces a substrate temperature indicating current of magnitude related to the temperature of the substrate. The substrate temperature indicating current at the second temperature is extrapolatedly related to the substrate temperature indicating current at the critical temperature.

In accordance with another broad aspect of the invention, a method is presented for testing a temperature warning circuit fabricated in an integrated circuit substrate. The warning circuit is intended in normal operation to produce a warning if the temperature of the substrate exceeds a critical temperature. The critical temperature may be a temperature above which operation of an operating circuit on the substrate is not desired. The method includes providing a warning circuit, and providing a programming circuit, such as an externally programmable non-volatile memory, such as EEPROM devices or the like, connected to select a temperature at which the warning circuit produces a warning. The non-volatile memory is first altered to select a lower temperature than the critical temperature for activating the warning circuit, and the temperature of the substrate is increased to a test temperature at the lower temperature. Then, at determination is made whether the warning circuit is activated at the test temperature. Finally, altering the non-volatile memory a second time to select the critical temperature for activating the warning circuit in normal circuit operation.

In one embodiment, the step of providing a warning circuit includes providing a current source that produces a substrate temperature indicating current of magnitude related to the temperature of the substrate, and extrapolating a current that produces a warning at the lower temperature from a current that would produce a warning at the critical temperature.

In accordance with still another broad aspect of the invention, an oscillator fabricated in an integrated circuit substrate for providing an output signal having an adjustable frequency is provided. The oscillator has a circuit for generating an oscillating signal, including an adjustable timing circuit for controlling the frequency oft he oscillating signal. An externally programmable circuit, such as a non-volatile memory or EPROM devices, is connected to adjust the timing circuit to control the frequency of the oscillating signal by a selection circuit responsive to the externally programmable circuit.

In accordance with yet another broad aspect of the invention, a method for adjusting a frequency of an oscillator is presented. The method includes the steps of providing a circuit for producing an oscillating output signal including a oscillation frequency timing circuit, providing a programming circuit connected to control the oscillation frequency timing circuit to adjust the timing, and altering the programming circuit to adjust the timing to control the output signal frequency.

In accordance with yet another broad aspect of the invention, a current source fabricated in an integrated circuit substrate is presented for providing an output current having an adjustable magnitude. The current source has a current generator for generating an output current, and an externally programmable circuit, such as a non-volatile memory, or a memory comprising EPROM devices. A selection circuit responsive to the externally programmable circuit adjusts the output current.

In accordance with yet another broad aspect of the invention, a method for adjusting an output current of a current source is presented. The method includes providing a circuit for producing an output current, providing a programming circuit, such as an externally programmable non-volatile memory or a circuit that comprises EPROM devices connected to control the magnitude of the output current, and altering the programming circuit to adjust the output current.

BRIEF DESCRIPTION OF THE DRAWINGS

The invention is illustrated in the accompanying drawings, in which:

FIGS. 7a and 7b are an electrical schematic diagram of an oscillator circuit whose frequency is varied through the use of non-volatile memory that alters the charge and discharge currents of the circuit.

In the various figures of the drawings, like reference numerals are used to denote like or similar parts.

DETAILED DESCRIPTION OF THE PREFERRED EMBODIMENTS

Figure 1:
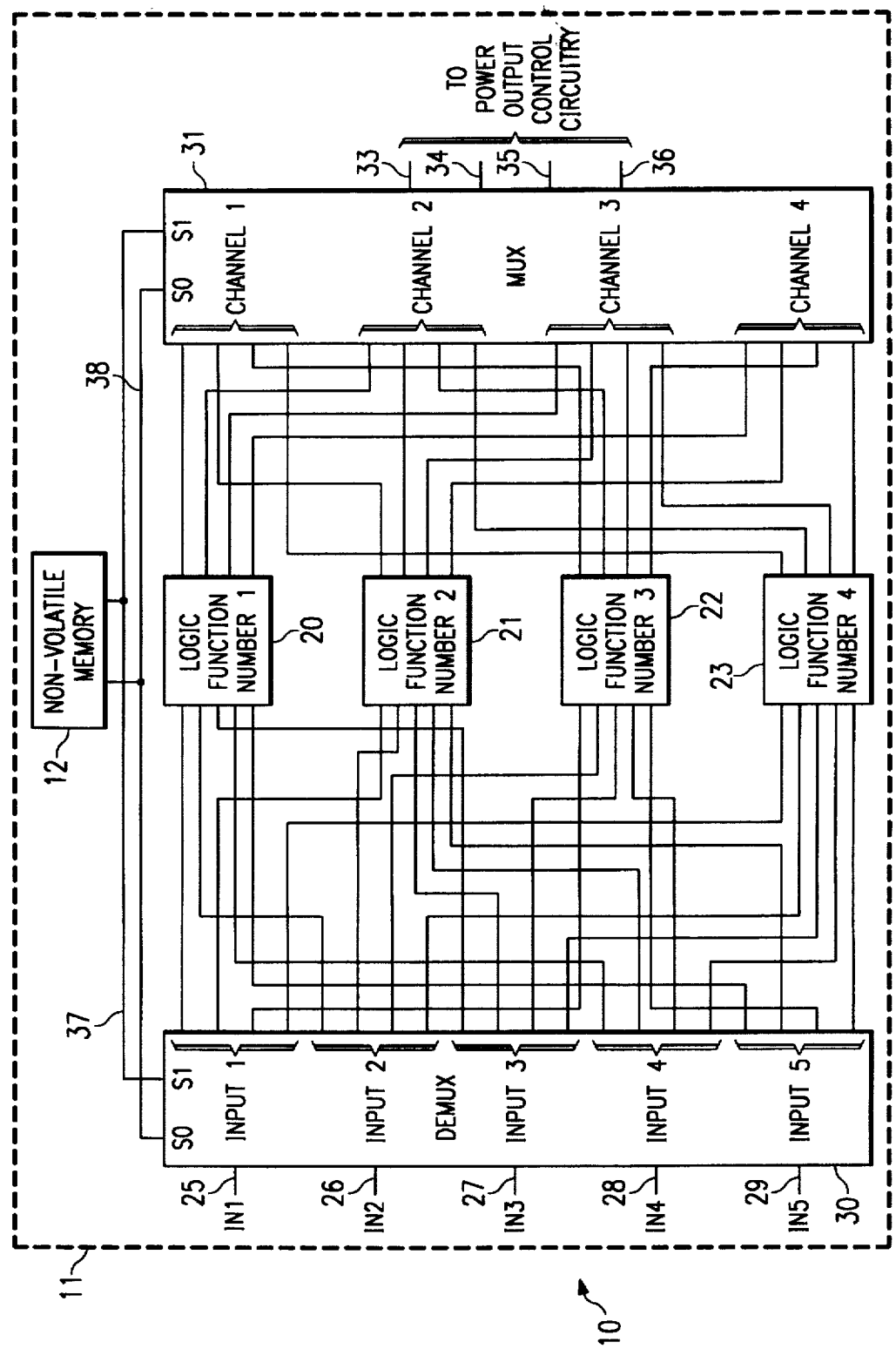
FIG. 1 is an electrical schematic block diagram of a multi-function power integrated circuit that is programmable using non-voltage memory to select a particular circuit function, in accordance with the invention.

In accordance with the present invention, a circuit design concept is presented that merges non-volatile memory with analog circuits, in general, and with linear or power integrated circuits, in particular. The result provides integrated circuit designers the ability to accurately "trim-in", or adjust, electrical parameters that would otherwise be impossible to regulate, for example, because of process variations, or the like, in the manufacture of the integrated circuit. The concept also provides the user the capability of changing the functionality of the device, and of adjusting the electrical parameters of the device, even on line, if required. The concept also provides a facility that enables fault reports to be stored.

Many power integrated circuit designs used in system applications have similar basic functions. However, significant enough differences exist from system to system, either in the functionality or in the electrical parameters required by each system, that the need for different power integrated circuit designs is dictated. By integrating non-volatile memory into a power integrated circuit design, in accordance with the invention, the system requirements for a multiple number of system designs can be realized in just one power integrated circuit.

In power integrated circuits, typically only a few basic output structures are required in most system designs. The logic functions required to control these output structures, however, vary among designs. Through the use of non-volatile memory, the user can be offered several different logic function options from which to select. Alternatively, a programmed array logic (PAL) type structure can be provided that allows the user to design a custom state machine to meet his specific needs.

While basic output structures and protection circuitry on power integrated circuits often do not change significantly from design to design, system specifications require the electrical parameters associated with these circuits to vary. Through the use of non-volatile memory, a range of operation within these specifications can be offered to the user, allowing maximum flexibility to meet a number of system needs. Things such as output slope control, thermal shutdown/sense trip point and hysteresis, current limit/sense level, oscillator frequency, over/under voltage shutdown/sense and hysteresis, and the like, are just a few examples of circuits with electrical parameters that can be varied through the use of non-volatile memory.

Thus, in accordance with the invention, in order to meet a variety of system applications with one integrated circuit, non-volatile memory elements are monolithically integrated on a power integrated circuit. There are many examples of such integrated circuits. For example, a non-volatile memory can be used to provide the system designer with several logic functions from which to choose. An example of such circuit 10 to provide such logic function selection on an integrated circuit chip 11 is shown in the block diagram of FIG. 1.

In the circuit 10, logic bits developed in a non-volatile memory 12, for example by EEPROM devices, EPROM devices, or the like (not shown), are decoded to select among several different integrated circuits, for example, to provide user selectable logic, linear, power supply, or other functions. The embodiment shown has four logic function blocks, 20–23, although any number of blocks can be employed. Input lines 25–29 are connected to a demultiplexer circuit 30. Although five input lines 25–29 are shown, it will be understood that any number of input lines can be used, depending upon the construction of the demultiplexer circuit and the number of logic bits provided by the non-volatile memory 12. Furthermore, the input lines 25–29 can also have output functions if desired, and if supported by the hardware construction. Also, it will be realized that although a single demultiplexer block 30 is shown, the demultiplexer block can contain a plurality of demultiplexer circuits to provide a number of output signal sets for connection, as below described.

The demultiplexer circuit 30 receives selection line inputs from the non-volatile memory 12 to effect the desired connection between the input lines 25–29 and sets of output lines, denoted INPUT1, INPUT2, INPUT3, INPUT4, and INPUT5. The internal demultiplexer connections can be configured in virtually any manner desired. For example, each of the input lines 25–29 can be switchably connected to a respective one of the lines in each output line set INPUT1, INPUT2, INPUT3, INPUT4, and INPUT5, depending upon the state of the signals from the non-volatile memory circuit 121 Alternatively, the input lines 25–29 can be switchably connected to some particular output line, depending upon the states of the input signals received by the demultiplexer 28 from the non-volatile memory 12, and one or more of the lines INPUT1, INPUT2, INPUT3, INPUT4, and INPUT5 can be connected as a feedback or signal transfer line from one of the logic function circuits 20–23 to another, as desired. Any number of such combinations can be easily accomplished.

In a similar manner, the selection line signals from the non-volatile memory 12 are connected to inputs of a multiplexer circuit 30 to control the interconnections between the output lines, denoted CHANNEL1, CHANNEL2, CHANNEL3, and CHANNEL4, and the circuit output lines 33–36. Again, the number of output lines 33–36 can be arranged virtually in any number or connection combination as needed. In the embodiment illustrated, for example, each of the output lines 33–36 can be switchably connected to a respective one of the lines in each output line set CHANNEL1, CHANNEL2, CHANNEL3, and CHANNEL4, depending upon the state of the signals from the non-volatile memory circuit 12.

As mentioned, the non-volatile memory circuit 12 can be constructed of non-volatile memory elements, such as EEPROM elements, EPROM elements, or the like, connected to produce a programmable logic state on one of the output lines 37 and 38. Although only two output lines from the non-volatile memory circuit 12 are shown, any number can be provided, as desired. It should also be noted that the non-volatile memory elements of the non-volatile memory circuit 12 may be constructed, as shown, in the same, or a single, integrated circuit substrate in which the logic function circuits 20–23, demultiplexer circuit 30, and multiplexer circuit 31 are constructed.

Figure 2:
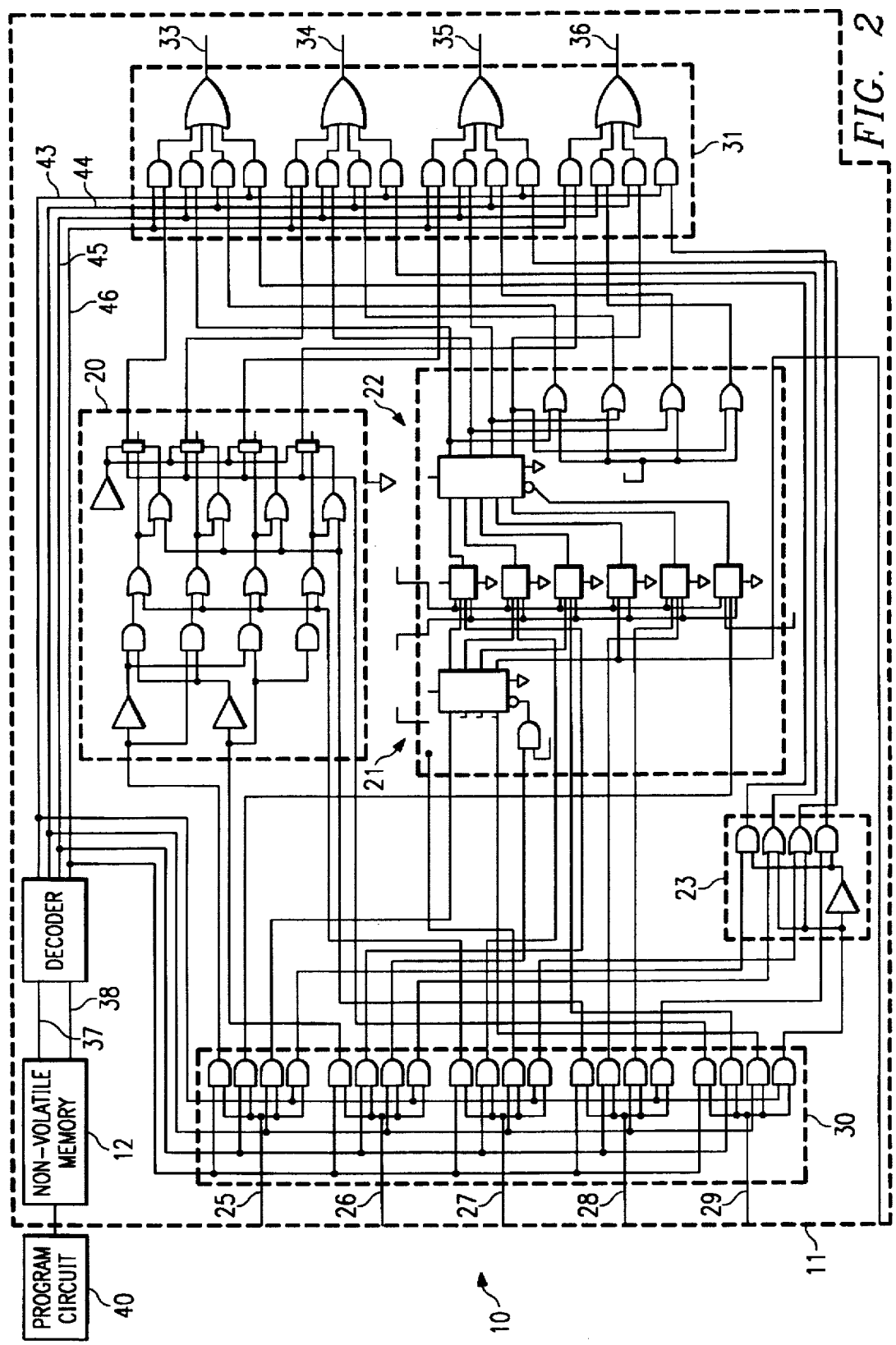
FIG. 2 is an electrical schematic diagram of the multi-function power integrated circuit of FIG. 1, showing the circuit details thereof.

A detailed schematic diagram of the circuit 10 of FIG. 1 is shown in FIG. 2, showing details of the demultiplexer circuit 30, the logic function circuits 20–23, and the multiplexer circuit 31. In the circuit of FIG. 2, the logic function circuits 20–23 can serve as selectable power integrated circuits; for example, logic circuit 20 can be constructed as a circuit type known by the type SN74HC259. The combined logic function circuits 21 and 22 can be constructed as a circuit types known by the type SN74HC595 and SN74HC273, respectively. The logic circuit 23 can be constructed as a circuit type known by the type SN75439. Of course other circuit types can be used, the illustrated types being described only by way of example.

In the circuit embodiment of FIG. 2, program circuit 40 is shown providing a programming input to the non-volatile memory circuit 12. The programming circuit can be included on the integrated circuit chip 11, if desired, or can be externally located, as shown. In any event, the programming circuit 40 can be constructed such as to program the non-volatile memory 12 to produce the necessary logic states on the output lines 37 and 38. For example, if the non-volatile memory 12 is comprised of EEPROM elements, the program means can include circuitry for applying appropriate programming voltages to the EEPROM elements in a manner well known in the art. It is also noted that in the circuit embodiment of FIG. 2, the signals on lines 37 and 38 are decoded to provide four selection signals on lines 43–46 for convenient operation of the demultiplexer circuit 30 and multiplexer circuit 31.

In operation, the circuit 10 provides a plurality of selectable integrated circuits 20–23 on a single integrated circuit chip 11. The user simply externally programs the non-volatile memory 12 to select one or more of the selectable integrated circuits 20–23 for connection between input lines 25–29 and output lines 33–36 of the integrated circuit.

Figure 3:
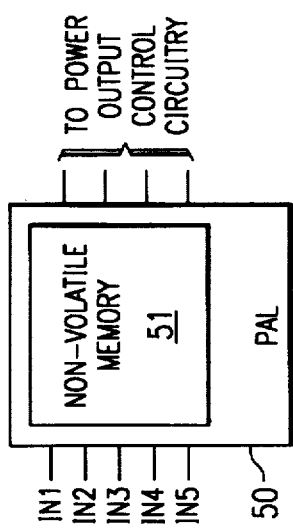
FIG. 3 is an electrical schematic block diagram of a programmable array logic circuit together with a non-volatile memory for programming of a state machine required to control associated power output control circuitry.

Although the circuit embodiment 10 described with reference to FIGS. 1 and 2 employed selectable logic function circuits 20–23, other circuit arrangements can be alternatively employed. For example, with reference to FIG. 3, the user can be provided with a programmable array logic (PAL) circuit 50, or similar circuit, integrated on the power integrated circuit together with a non-volatile memory 51 to enable, for instance, programming of a state machine required to control associated power output control circuitry (not shown). The limitation in such circuit arrangement is the non-volatile memory array size.

The non-volatile memory can also be used to vary key electrical parameters on an integrated circuit. Any electrical parameter that can be varied with a digital bit pattern in a circuit can be controlled or varied using non-volatile memory. One example of implementation of this idea is shown in the analog current sensing circuit 60 of FIG. 4. The current sensing circuit 60 delivers a digital fault signal once a predetermined current level is reached. In this case, the current sensing level is varied by changing the total current flowing through resistor 61. The current at which a fault is reported is varied using the user programmable non-volatile memory 63 to provide logic states on output lines 64–66, to switch in various, selectable amounts of current through the resistor 61. The user programmable non-volatile memory 63 can be EEPROM elements, EPROM elements, or the like.

The current sensing circuit and non-volatile memory of the circuit 60 are fabricated on a common integrated circuit chip 68, as shown. Of course, other circuit configurations can be equally advantageously used to develop a threshold at which a sense current is generated, besides the current mirror circuit illustrated.

Another major problem for integrated circuit designers is to meet tight customer specifications, while at the same time taking into account the effects of full process variations. To address this problem, designers often use electrical "trim" in order to meet tight specifications that would otherwise be impossible to meet, while maintaining good yield across process variations. One technique employed in electrical trim operations, for example, involves using a laser to cut or modify the physical size of an integrated circuit component, such as a resistor or capacitor. In many cases, however, electric parameters are virtually impossible to trim or regulate, for example, because of process variations, or the like, in the manufacture of the integrated circuit. Non-volatile memory offers a means of adjusting this trim without physically "blowing" some component on the chip, such as an antifuse, or the like. As a result, a parameter can be more accurately trimmed with fewer bits than previously possible, since the trim provided by non-volatile memory is not "permanent" in the sense that once a bit is "blown" it can be "un-blown" if necessary.

In the same sense as varying an electrical parameter with non-volatile memory, the same is true in "trimming in" an electrical parameter. The difference is that varying an electrical parameter is done by the system designer, whereas controlling the trim is varied at multi-probe test stages, and is transparent to the end user of the integrated circuit.

Figure 4:
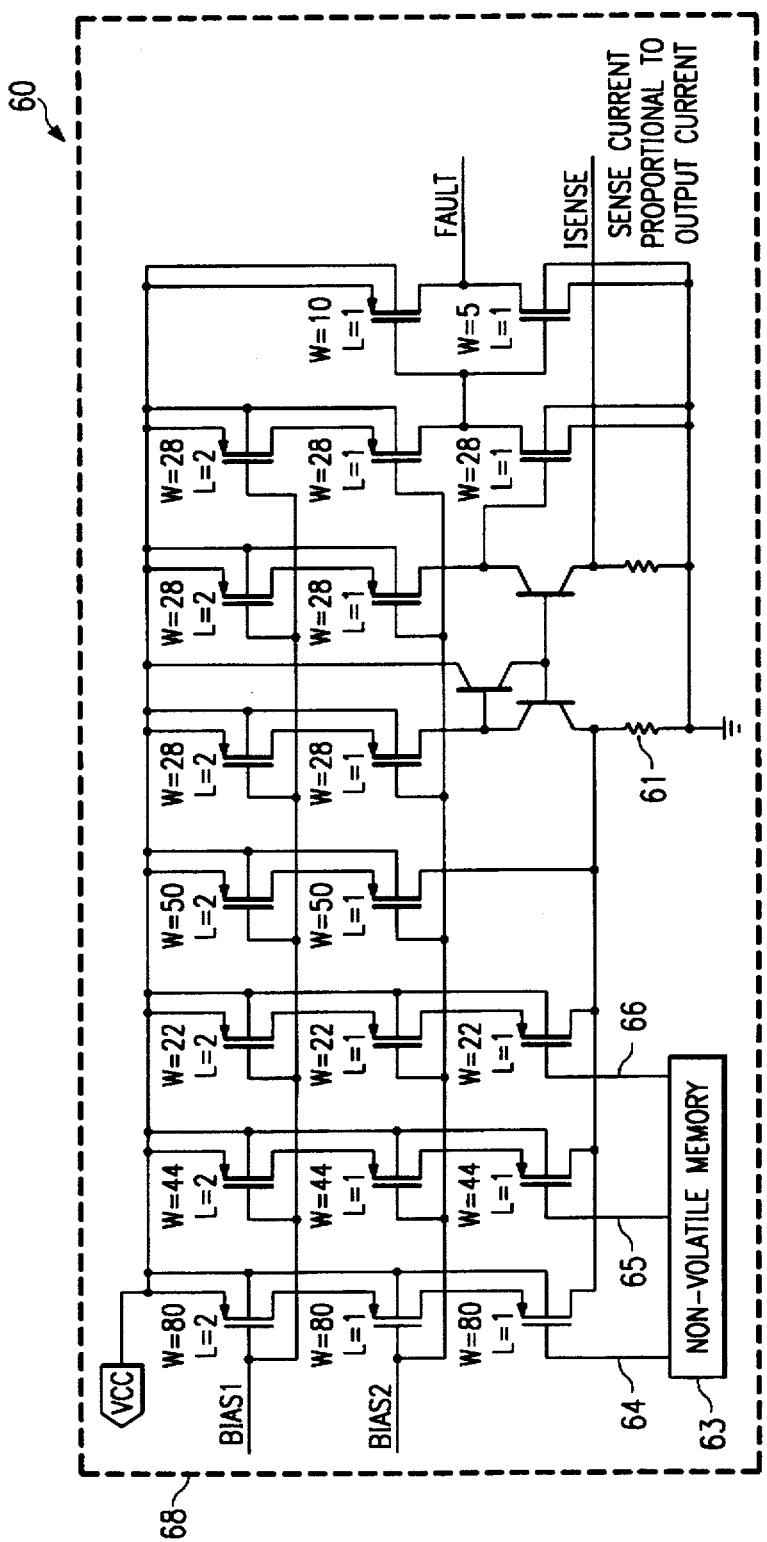
FIG. 4 is an electrical schematic diagram of a circuit employing non-volatile memory in accordance with the invention to vary key electrical parameters on an integrated circuit, in particular, to vary a predetermined current level at which a digital fault signal is delivered.
Figure 5:
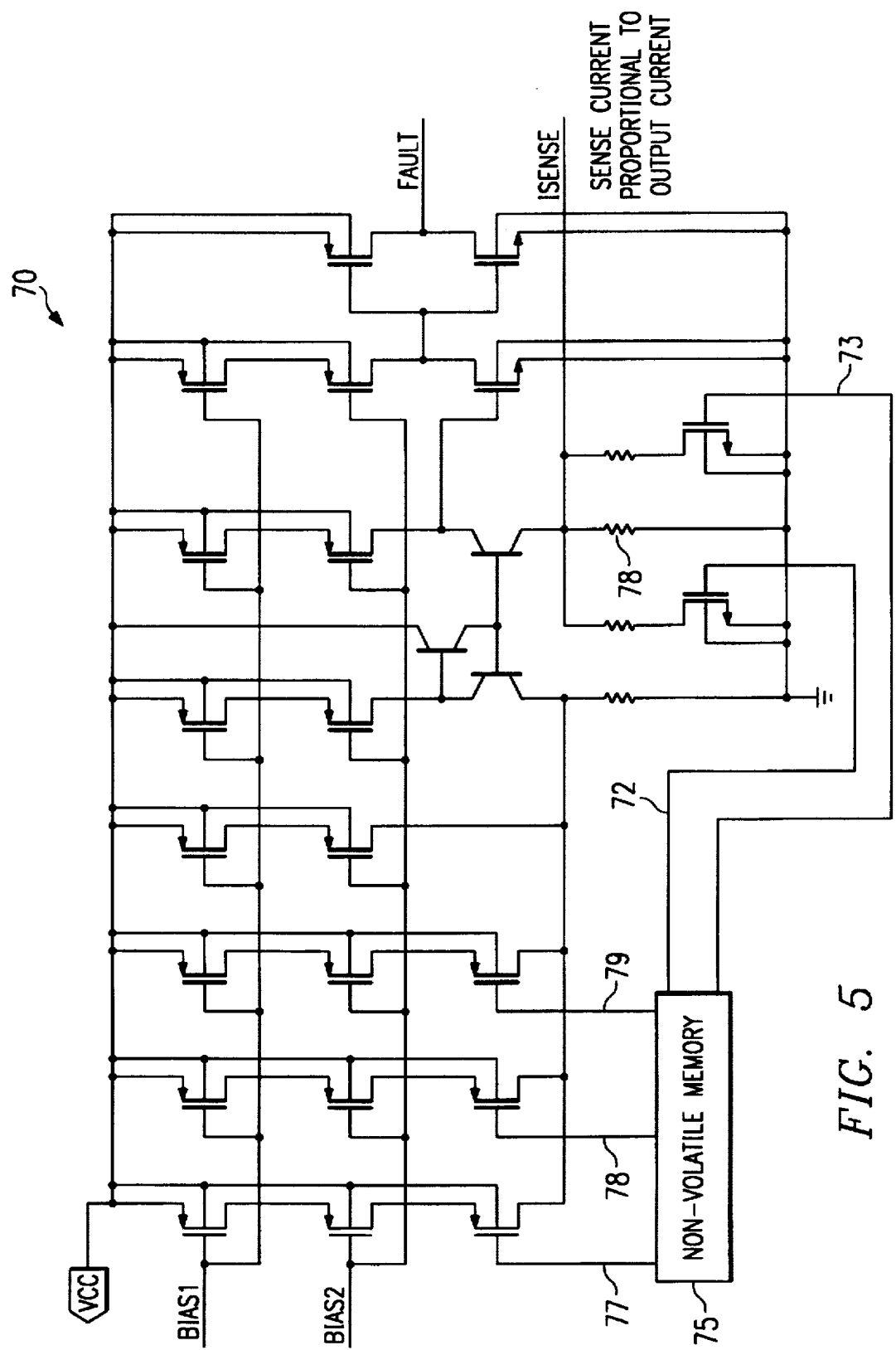
FIG. 5 is an electrical schematic diagram of the current sensing circuit of FIG. 4 that has been modified to provide a capability of adjustment in both the electrical parameter and an electrical trim parameter.

For example, a current sensing circuit 70 that has been modified from the current sensing circuit 60 described above with reference to. FIG. 4 is shown in FIG. 5. The circuit 70 provides a capability of adjustment in both the electrical parameter, i.e., the threshold current, and an electrical trim parameter, i.e., the current centering value. More particularly, in the circuit 70 of FIG. 5, two memory bits on lines 72 and 73 from non-volatile memory elements of the non-volatile memory 75 are used to center the current sense value by effectively varying the value of a resistor 78, while also retaining the current sense level variability in dependence upon the states presented on lines 77–79 from the non-volatile memory elements, as discussed above.

Figure 6A:
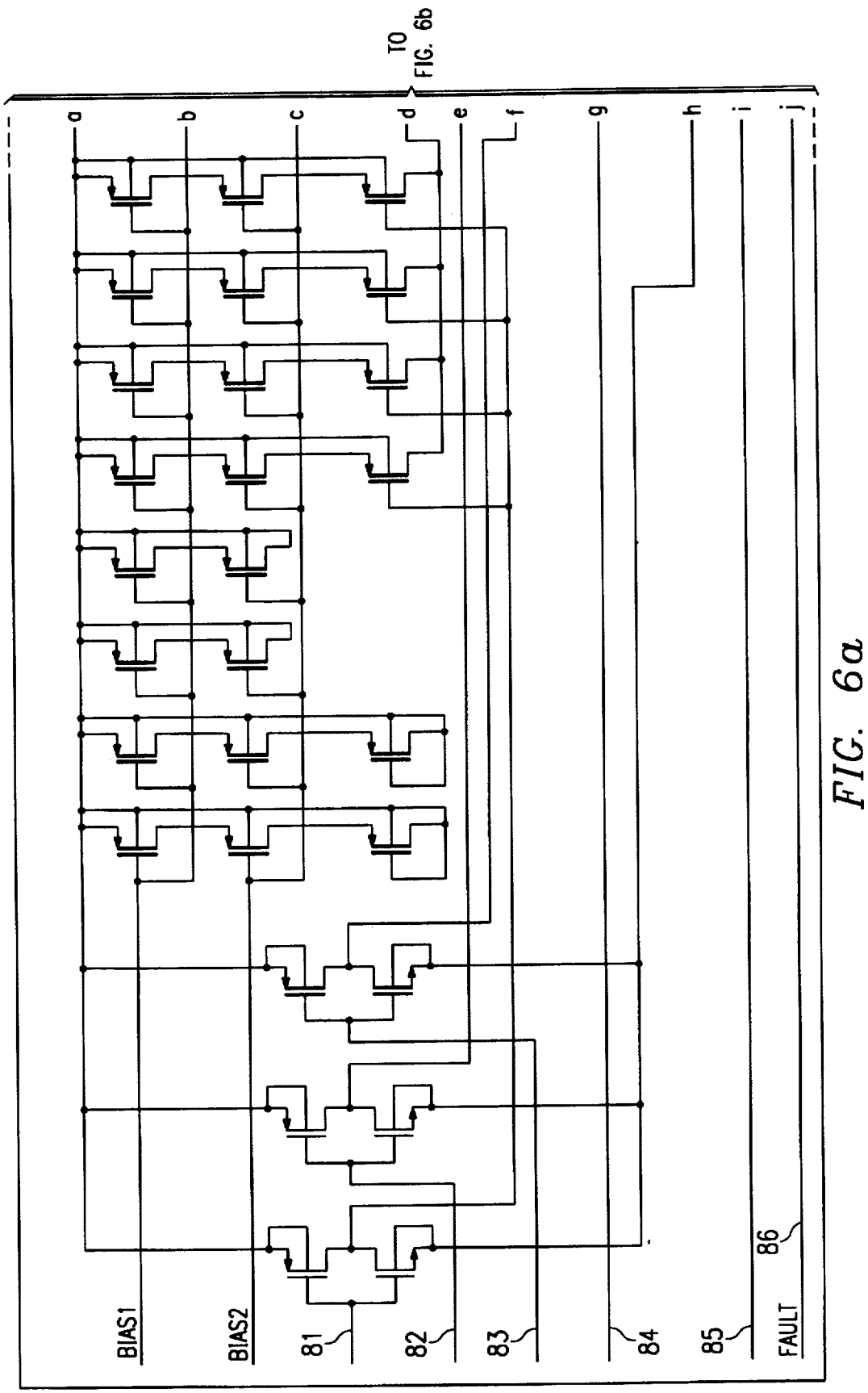
FIGS. 6a and 6b are an electrical schematic diagram of a CMOS version of the current sensing circuit of FIG. 5 that has capabilities of adjustment in both the electrical parameter and an electrical trim parameter.
Figure 6B:
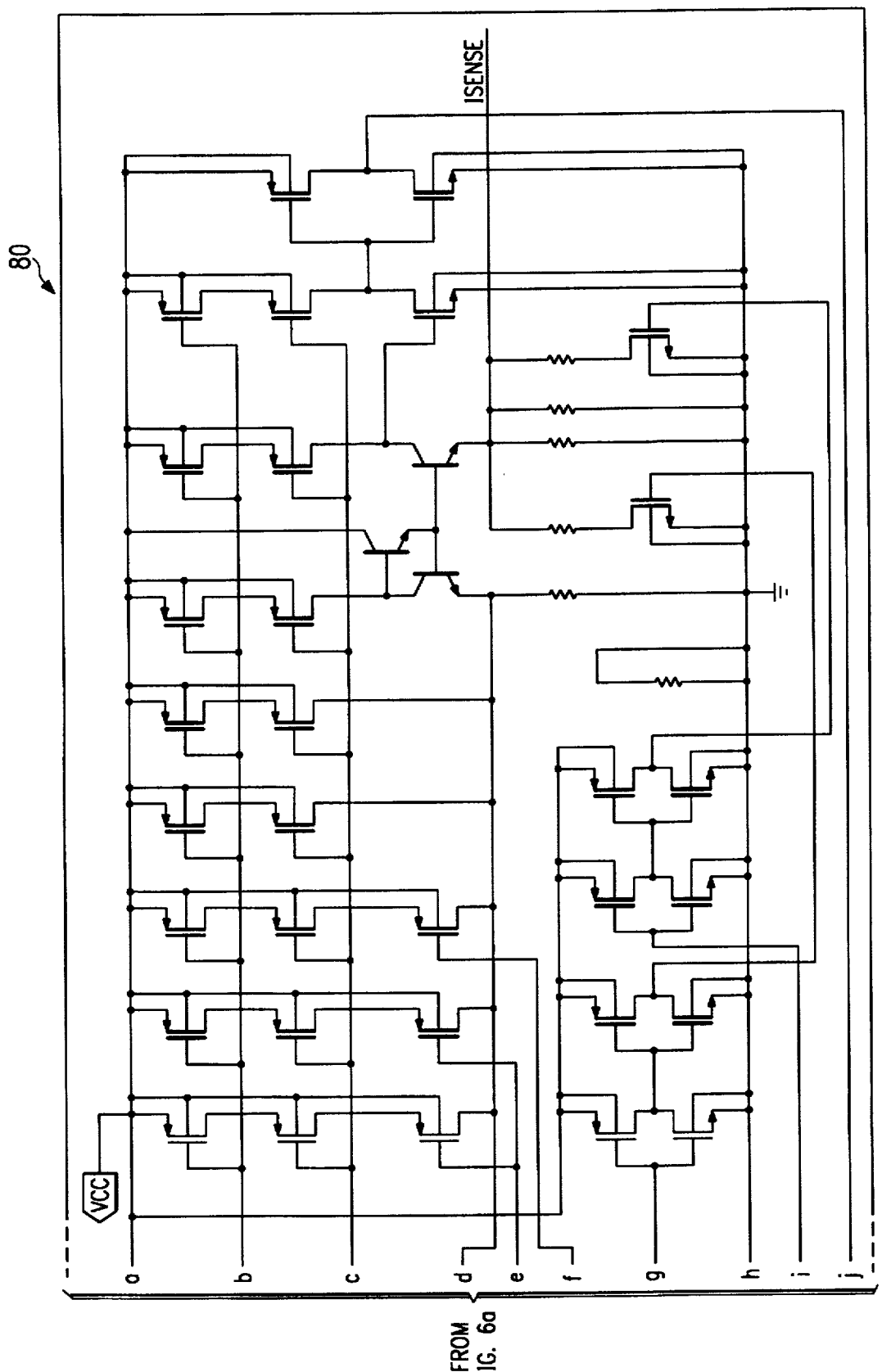

A CMOS version 80 of the current sensing circuit 70 of FIG. 5 is shown in FIGS. 6a and 6b, in which capabilities of adjusting the threshold current and of trimming the current centering value are provided. In the circuit 80, the threshold current can be adjusted by the states applied from non-volatile memory elements (not shown) to lines 81–83, and the trim can be adjusted by the states applied from non-volatile memory elements to lines 85–86.

Figure 7B:
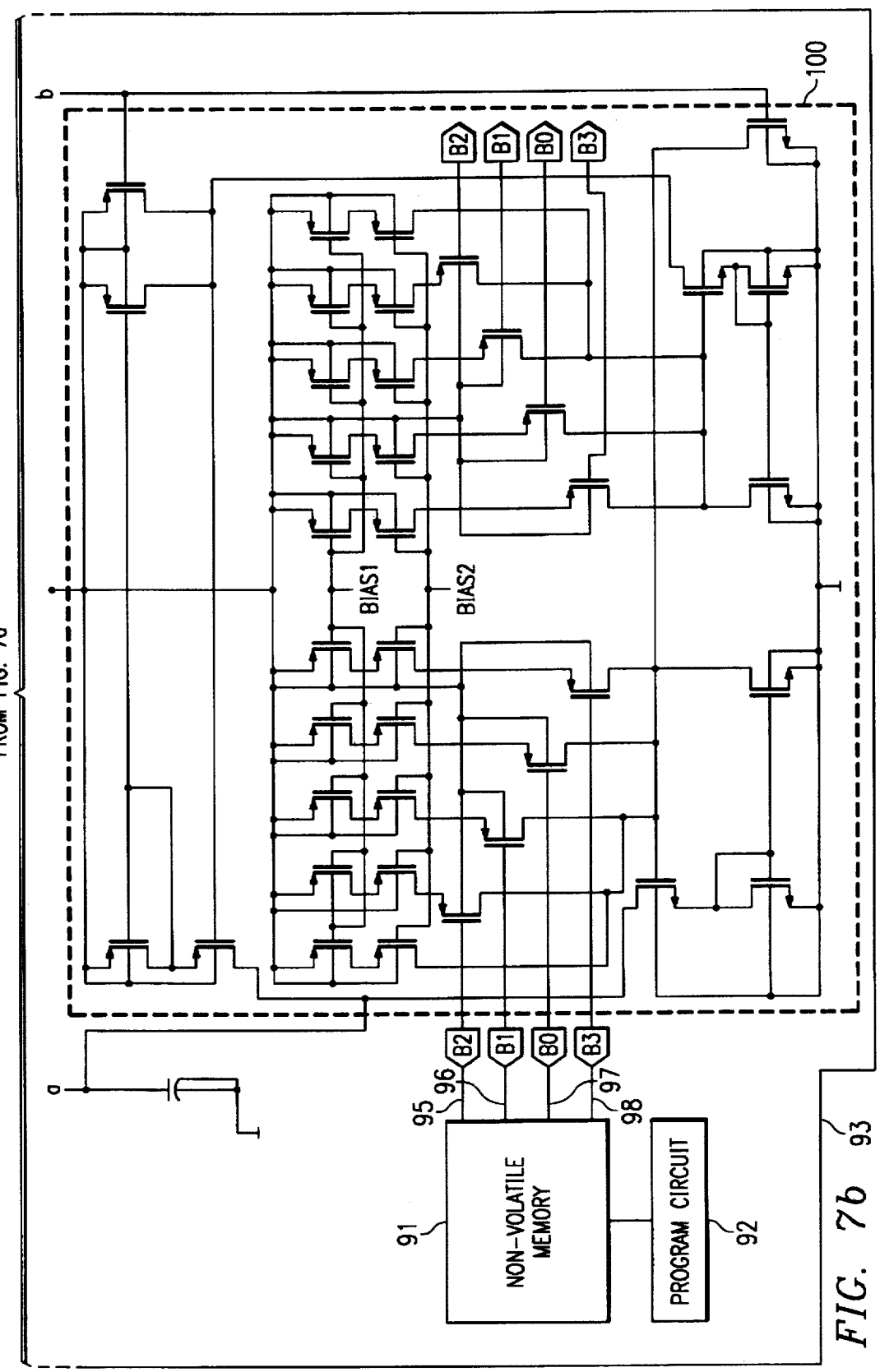

Non-volatile memory can be used in other circuits as well. For example, an oscillator circuit 90 whose frequency is varied through the use of non-volatile memory 91 that alters the charge and discharge currents is shown in FIGS. 7a and 7b. The circuit 90 includes a program circuit 92 by which the non-volatile memory 91 is programmed, all fabricated on a single integrated circuit chip 93. It should be noted that the program circuit 93 and non-volatile memory 91 can optionally be provided separate from the chip 93, if desired.

The non-volatile memory 91, which can comprise EEPROM devices, or the like, has four output lines 95–98 that have logic states determined by the states of the respective memory elements of the non-volatile memory 91 that can be externally programmed by a user. Again, the non-volatile memory 92 can be fabricated of EEPROM elements, EPROM elements, or the like. The output lines 95–98 are connected to a circuit 100 that controls the charge and discharge currents through the oscillator comparators 101 and the oscillator RS flip flop 102 to control the frequency of the output signal on the output line 104. Thus, the oscillator, in the embodiment illustrated, includes an oscillator comparison portion 101, an RS flip flop 102, and a charge/discharge circuit 100 for controlling the frequency of the oscillator on the oscillator output line 104.

In operation, the frequency of the circuit 90 is adjusted simply by programming the non-volatile memory circuit 91 that is connected to control the oscillation frequency timing circuit 100. If a different frequency is desired, the non-volatile memory is simply reprogrammed to select a new set of output states on lines 95–98 to control the output signal frequency on line 104.

Another use exemplar for non-volatile memory is described with reference to the thermal detect circuit 120 of FIG. 8. One of the circuits that is often provided on an integrated circuit is a test circuit to monitor the temperature of the substrate, especially close to a junction of a power transistor, or the like. The thermal detect circuit is configured to produce an error or warning signal if the temperature of the substrate exceeds a predetermined threshold, so that circuit shutdown can be initiated or other appropriate action taken.

One of the problems in the design and operation of such a thermal detect circuit, is testing the thermal detect circuit to insure proper operation of the circuit of the critical trip temperature. In order to do such thermal detect circuit testing, it is necessary to raise the substrate temperature to the critical temperature at which the circuit generates its warning. Bringing the substrate temperature to such critical temperature, however, may cause degradation of the circuit, or may destroy it entirely. Thus, according to the invention, a circuit is provided that includes non-volatile memory programmed to define one (or more) safe test temperatures to be established that are below the critical temperature. The thermal detect circuit can then be tested at the safe temperatures. Then, if the thermal detect circuit operates properly to warn upon reaching the safe temperature, the non-volatile memory can be reprogrammed to establish the critical temperature as the threshold for the thermal detect circuit.

Figure 8:
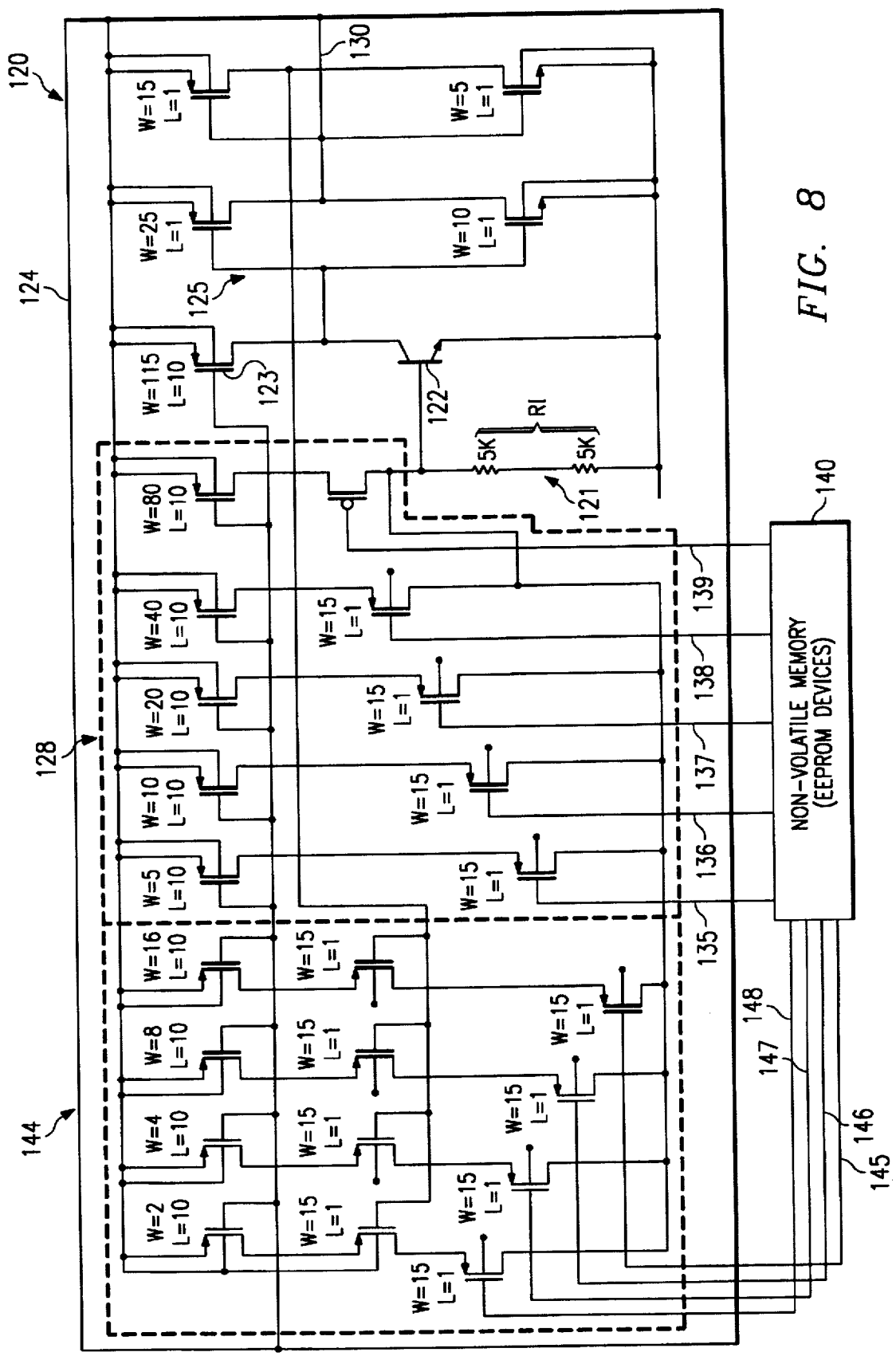
FIG. 8 is an electrical schematic diagram of a test circuit for monitoring a temperature of an integrated circuit, the temperature trip point of the test circuit itself being non-destructively testable, using non-volatile memory.

Thus, a circuit 120 shown in FIG. 8 includes a resistor 121, which may be a zero-temperature coefficient resistor, through which a current flows. A bipolar transistor 122 is connected with its base emitter junction corrected in parallel with the resistor 121 and its collector to a supply voltage through a MOS transistor 123. The current that flows through the collector-emitter path of the bipolar transistor 122 is dependent upon the base-emitter voltage drop on the transistor 122, as well as the temperature of the substrate 124 in which the transistor 122 is constructed. The threshold circuit 128 is a current sourcing block that generates a voltage drop across the resistor 121. This voltage drop is also across the base-emitter junction of the transistor 122. This voltage drop can be set to define the constant over temperature.

The collector-emitter current flowing through the transistor 122 is minimal at safe temperatures, thus not allowing the collector voltage to fall to trip the inverter string 125. However, as the temperature of the substrate begins to rise, the current through the collector-emitter path of the transistor 122 increases. The collector node voltage of the transistor 122 will not fall until the collector-emitter sink current equals the sourcing current of the MOS mirror transistor 123. At the point where currents are the same through the sink transistor 122 and the source transistor 123, the collector node voltage of the transistor 122 will fall, thus causing the inverter string 125 to trip warning node 130.

The threshold circuit 128 is controlled by a circuit responsive to the contents of non-volatile memory 140 for establishing said threshold temperature at a predetermined threshold temperature. In the embodiment illustrated, five bias circuits are provided that are selected individually or in combination by the states of input lines 135-139 as determined by an externally programmable circuit, such as a non-volatile memory 140 that may comprise, for instance EEPROM devices, EPROM devices, or the like. The selection of one or more of the bias circuits establishes the voltage bias on the resistor 121 and across the base-emitter junction of the transistor 122 to thereby establish the threshold current that produces a warning output signal for a given substrate temperature on output line 130. One of the current biases that is established by the circuit 128 is a first predetermined threshold temperature that represents a critical temperature above which operation of a circuit (not shown) on said substrate is not desired. In addition, the circuit 128 establishes at least one second predetermined threshold temperature that is lower than the first predetermined threshold temperature to enable testing of the circuit 120. The current through the resistor 121 in the circuit 120 at the second temperature is extrapolatedly related to the current in the transistor 122 at the critical temperature.

Thus, in operation, the non-volatile memory is programmed to select a safe threshold temperature at which the warning circuit and the temperature of said substrate is increased to the safe test temperature. A determination is then made whether the warning circuit has been activated at the safe test temperature. Thereafter, the programming circuit 140 is modified to select the critical temperature for activating said warning circuit.

If desired, a thermal hysteresis circuit 144 may be provided, also controlled by states defined by the memory elements of the non-volatile memory 140 on respective lines 145-148. Other circuit functions may also be provided if desired.

It will become apparent from the above that the association of non-volatile memory with traditional power and analog integrated circuit devices offers great advantages that are not easily achieved. Other circuit arrangements and uses will be apparent to those skilled in the art.

For example, one problem that exists with virtually all systems is field failures. Field failures of one component can ultimately cause system destruction. On the other hand, field failures can sometimes allow the system to continue to work, but work incorrectly. These types of failures can be permanent or intermittent. If the failure is permanent, it can be easily recognized by the field technician fixing the system. However, if the failure is intermittent, it can be very difficult to resolve. In order to understand what has caused a component to fail, it is often important to be able to look at the history of faults on the integrated circuits that have failed. This is particularly true in the case of intermittent failures. Through the use of non-volatile memory, this type of fault history can be maintained. Things such as the number of faults, the type of fault, the time of the fault, the junction temperature at the time of the fault, and so forth, are the type of data that is useful in troubleshooting failures, and can be stored in on-board non-volatile memory.

Thus, By utilizing non-volatile memory in power integrated circuit designs, a means is provided to enable a fault to be reported at the time it occurs, and the report to be stored. The result can then provide the field technician a better means of troubleshooting the problem. All of this data can help the system designer understand and identify the ultimate problem, which could lead to components in the system, the environment in which the system is used, or the misuse of the system in the field.

Technical advantages

The integrated non-volatile memory on a power integrated circuit offers the system designer a wide range of flexibility without the added cost of external components or external circuitry. In many cases it may add flexibility that would otherwise be impossible to implement.

In the case oft rim capabilities, the ability to change the trim setting means that the same trim resolution can be attained using fewer bits. For example, there is no need to have a number of fine trim bits, since the change is not permanent, in a sense line when the fuse/Zener zap is blown. The non-volatile memory allows for a true binary trim scheme without the complications of the test routine to try and absolutely determine what needs to be "zapped" prior to trimming.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A temperature warning circuit for testing an integrated circuit without damaging the integrated circuit, comprising:
   a first circuit for generating a temperature warning signal if a temperature of the integrated circuit exceeds a predetermined first temperature;
   a second circuit for generating a temperature warning signal if a temperature of the integrated circuit exceeds a predetermined second temperature, said second temperature being less than said first temperature, said second temperature being related to said first temperature whereby if an extrapolation is made between said first and second temperatures, the first and second warnings can be similarly extrapolated;
   a selection circuit for programmably selecting between said said first and second circuits for operation.

2. A circuit for testing for a temperature of an integrated circuit substrate, fabricated in said substrate and comprising:
   a circuit for generating a warning if the temperature of the substrate reaches a programmably selectable threshold temperature;
   an externally programmable and reprogrammable non-volatile memory; and
   a circuit responsive to the contents of said non-volatile memory for establishing said threshold temperature at either a first or a second predetermined threshold temperature.

3. The circuit of claim 2 wherein said first predetermined threshold temperature is a temperature above which operation of a circuit on said substrate is not desired, and said second predetermined threshold temperature is a temperature lower than said first predetermined threshold temperature.

4. A testable warning circuit fabricated in an integrated circuit substrate for providing a warning if a temperature of said substrate exceeds a critical temperature, comprising:
   a circuit for generating a warning if the temperature of the substrate exceeds a programmably selectable temperature;
   an externally programmable and reprogrammable circuit; and
   a selection circuit responsive to said externally programmable circuit for establishing said programmably selectable temperature at either said critical temperature for a normal operation or a second predetermined temperature lower than said critical temperature for testing whether said warning circuit is operating.

5. The warning circuit of claim 4 wherein said externally programmable circuit is a non-volatile memory.

6. The warning circuit of claim 5 wherein said non-volatile memory comprises EPROM devices connected to control the selection circuit to establish said programmably selectable temperature.

7. The warning circuit of claim 4 wherein said critical temperature is a temperature above which operation of an operating circuit on said substrate is not desired.

8. The warning circuit of claim 4 wherein said selection circuit comprises a current source that produces a substrate temperature indicating current of magnitude related to the temperature of said substrate.

9. The warning circuit of claim 8 wherein said substrate temperature indicating current at said second temperatures is extrapolatedly related to said substrate temperature indicating current at said critical temperature.

10. A method for operating a temperature warning circuit fabricated in an integrated circuit substrate, said warning circuit being intended to produce a warning if a temperature of said substrate exceeds a critical temperature, comprising:
    providing a warning circuit;
    providing a programming circuit in said substrate connected to select a temperature at which said warning circuit is activated to produce a warning;
    altering said programming circuit to select a lower temperature than said critical temperature for activating said warning circuit;
    increasing a temperature of said substrate to a test temperature at said lower temperature;
    determining whether said warning circuit is activated at said test temperature; and
    altering said programming circuit to select said critical temperature for activating said warning circuit.

11. The method of claim 10 wherein said programming circuit is an externally programmable non-volatile memory.

12. The method of claim 11 wherein said externally programmable non-volatile memory comprises EPROM devices.

13. The method of claim 10 wherein said critical temperature is a temperature above which operation of an operating circuit on said substrate is not desired.

14. The method of claim 10 wherein said step of providing a warning circuit comprises providing a current source that produces a substrate temperature indicating current of magnitude related to the temperature of said substrate.

15. The method of claim 14 wherein the magnitude of the indicating current that produces a warning at said lower temperature is extrapolatedly related to the current that would produce a warning at said critical temperature.

* * * * *